(12) United States Patent
Noll

(10) Patent No.: US 6,313,635 B1
(45) Date of Patent: Nov. 6, 2001

(54) HIGH VOLTAGE SENSOR ASSEMBLY

(75) Inventor: Charles G. Noll, Sellersville, PA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 09/454,036

(22) Filed: Dec. 3, 1999

(51) Int. Cl.[7] ................................................. F23Q 23/10
(52) U.S. Cl. ........................ 324/395; 324/122; 340/660; 340/654
(58) Field of Search ................................ 324/158.1, 395, 324/122, 127, 72.5, 133; 340/620, 660, 654

(56) References Cited

U.S. PATENT DOCUMENTS

| | | |
|---|---|---|
| 3,120,626 | 2/1964 | Schweriner . |
| 3,156,847 | 11/1964 | Schweriner . |
| 3,171,113 * | 2/1965 | Mcnamara ........................ 324/158.1 |
| 3,179,849 | 4/1965 | Schweriner . |
| 3,369,152 | 2/1968 | Spengler . |
| 3,551,743 | 12/1970 | Koepke et al. . |
| 3,584,258 | 6/1971 | Barnett . |
| 3,760,229 | 9/1973 | Silverberg . |
| 3,970,932 | 7/1976 | Harvey . |
| 3,991,367 | 11/1976 | Chapman et al. . |
| 4,053,770 | 10/1977 | Tanaka et al. . |
| 4,152,643 | 5/1979 | Schweitzer, Jr. . |
| 4,259,545 | 3/1981 | Hayden . |
| 4,318,578 * | 3/1982 | Ericson et al. ........................ 339/14 |
| 4,440,553 | 4/1984 | Helmus et al. . |
| 4,745,895 * | 5/1988 | Seilenbinder et al. ............... 340/620 |
| 4,794,329 | 12/1988 | Schweitzer Jr. . |
| 4,814,933 | 3/1989 | Filter et al. . |
| 4,870,343 | 9/1989 | Dooley et al. . |
| 5,051,733 | 9/1991 | Neuhouser . |
| 5,065,142 | 11/1991 | Green . |
| 5,307,234 | 4/1994 | Homolka . |
| 5,363,045 * | 11/1994 | Martin et al. ........................ 324/395 |
| 5,570,266 | 10/1996 | Testone . |

OTHER PUBLICATIONS

Advertisement for Haug Power Pack Test Lamp, 1 page, date unknown.
SIMCO Drawing No. 4,101,579, Jun. 22, 1984.
SIMCO Drawing No. 4,220,054, Jul. 20, 1982.

\* cited by examiner

Primary Examiner—Safet Metjahic
Assistant Examiner—Jimmy Nguyen
(74) Attorney, Agent, or Firm—Akin, Gump, Strauss, Hauer & Feld, L.L.P.

(57) ABSTRACT

A high voltage sensor that is adapted to be connected to a terminal. The terminal is disposed in a housing having an outer surface and having a chute extending inwardly from the outer surface to a distal position inside of the housing. The high voltage sensor includes a sensor body that is adapted to be inserted into the chute and has a distal end and a proximal end. A contact is mounted on the distal end of the sensor body. An indicator circuit is substantially enclosed in the sensor body and includes an indicator lamp. The indicator circuit is electrically connected to the contact and the terminal is in electrical contact with the contact upon insertion of the sensor body into the chute of the housing.

16 Claims, 2 Drawing Sheets

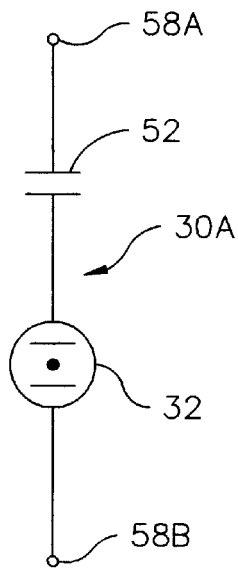
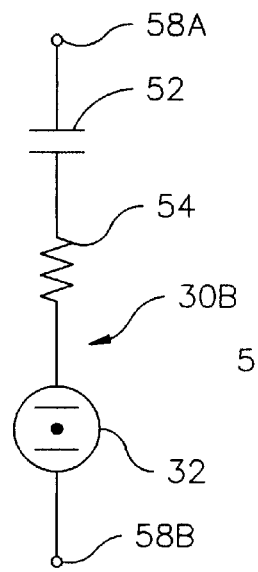
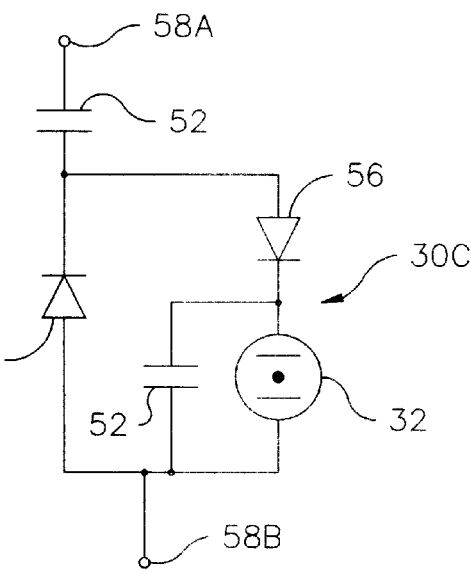
*Fig. 1A*   *Fig. 1B*   *Fig. 1C*
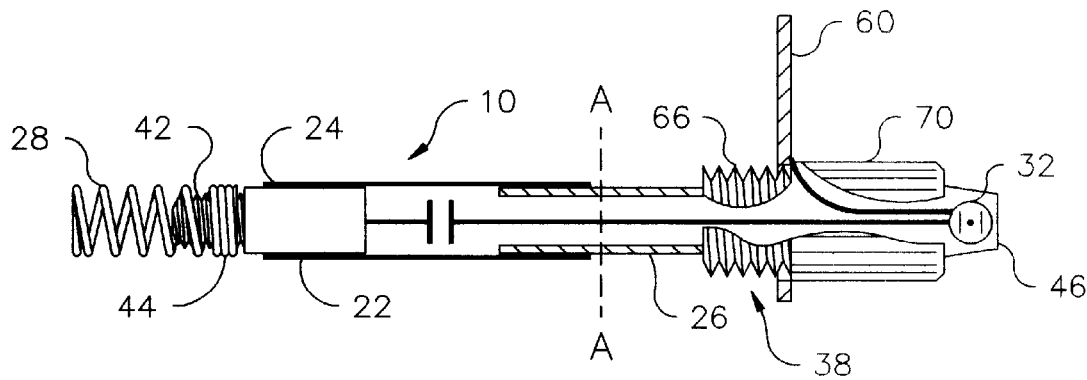
*Fig. 2A*
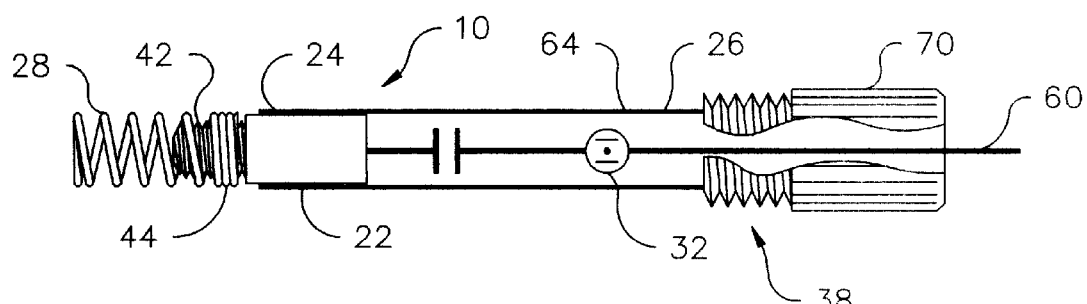
*Fig. 2B*

HIGH VOLTAGE SENSOR ASSEMBLY

BACKGROUND OF THE INVENTION

The present invention relates generally to static eliminators that use high voltage alternating current to ionize air and thereby produce mobile ions that are attracted to electrically charged articles until those articles are electrically neutral and, more specifically, to a high voltage sensor that can monitor the power supply used with static eliminators, as well as other high voltage devices.

Alternating current static eliminators have been widely used to eliminate or suppress static electricity on electronic equipment, sheets and webs of nonconductive material, plastic parts and food containers, fluid and bulk solids, and on many other uninsulated or ungrounded articles. The source of alternating current for AC static eliminators is known as a "high voltage power source," or a power unit, which is usually a current limited or ferroresonant transformer. The "high voltage power source" is supplied with alternating electric current from conventional mains, typically conditioned to be within the range of 100–440 volts alternating current and cycling at either 50 or 60 Hertz. The secondary windings of the high voltage power source operate at between 4,000 and 10,000 volts, with the current being limited to about five milliamperes to protect users from receiving severe shocks.

There are many alternating current static eliminating designs. The lower voltage designs usually have the ionizing electrodes and the passive electrodes directly connected to the alternating current power source ferroresonant transformer. The higher voltage designs use a resistance (as shown in U.S. Pat. No. 3,760,229) or capacitance (as shown in U.S. Pat. No. 3,120,626) in series with the alternating current power source to limit the electrode current and protect workers from shock or ignition of hazardous vapors. Most designs maintain the ionizing electrode at a high voltage while the remaining designs use an ionizing electrode that is maintained at ground potential (as shown in U.S. Pat. No. 3,369,152). Other designs have both electrodes isolated from ground (as shown in U.S. Pat. Nos. 4,053,770 and 5,307,234) that use the voltage difference between electrodes to drive the ionization process. The above designs can be incorporated into "single point ionizers," "static bars" that are linear rays of single point ionizers, blow-off guns and nozzles (as shown in U.S. Pat. Nos. 3,156,847 and 3,179,849), ionizer fitted air movers (as shown in U.S. Pat. No. 4,440,553), or the like. The variety of electrode designs and operating voltages requires that a high voltage sensor be capable of use with the various usable designs and electrode voltages.

Typically, the high voltage power source on a static eliminator is provided with an indicator light, which is intended to indicate that the alternating current static eliminator is "on." In other words, the indicator light indicates that the static eliminator is being supplied with electric current from the mains. The problem with this approach is that it reveals only that power is connected to the primary windings of the high voltage transformer. This can be problematic as it is the voltage across the secondary windings of the transformer that drives the ionization from the electrodes. Thus, the sensor can generate misleading information when there is a failure in the secondary winding or in the electrode system connected to that winding. Accordingly, when the sensor is attached to the primary windings, it is possible that even though the indicator light is in the "on" condition, the ionizing apparatus may be essentially non-functioning. Thus, ideally, a high voltage sensor should be able to establish whether the output (i.e., secondary winding) of the transformer is shorted out by the failure of the ionizer, the high voltage wire, or the transformer insulation systems.

An alternating current static eliminator uses an oscillating voltage that is the same at all ionizing electrode sets and along all connecting wires to the alternating current source. The conductor system is an equipotential system. The amplitude of the voltage depends upon the load and ionizer design. In monitoring the potential for ionization, it is therefore sufficient to use one sensor to monitor the entire ionizer system. Accordingly, the sensor should be placed at the most convenient location on the high voltage power source for monitoring the static eliminator system. Thus, ideally, the high voltage sensor should be designed to be sufficiently flexible with respect to being positionable at various locations along the combination high voltage power source and static eliminator system, including being positionable along the wires connecting the alternating current source with the AC static eliminators. This allows the sensor to be placed at the most convenient location for monitoring the system.

The insulation system of a static eliminator, including cables, is normally exposed to hostile industrial environments and consequently has a finite life. As such, failure detection circuits are important to alert equipment operators when static elimination is no longer occurring. Accordingly, an ideal high voltage sensor should match and preferably exceed the durability of the other components of the ionizer system. Additionally, the high voltage sensor should be replaceable separately from the other components of the ionizer system.

High voltage sensors can be generally classified as either directly coupled or capacitively coupled. Directly coupled high voltage sensors are attached directly between the high voltage terminals. Some directly coupled high voltage sensors operate from current drawn from the secondary windings of the high voltage power source, while others rely on current drawn from the mains to drive the electrical circuitry. The use of power from the mains permits brighter visual indications of failure, allows the use of relays to operate control circuits, and makes possible the use more sophisticated provisions for interpretation of failure modes. The sensing and relay circuits of the mains-powered circuits are generally located inside the high voltage power source.

Typical direct coupled sensors, such as the SK-4/7 from Simco Japan, include a failure detection circuit to turn "off" the high voltage and inform the operator when there is a high voltage electrode or cable failure. The sensing circuits are mounted inside the high voltage high voltage power source and include a voltage divider across the output of the transformer. Simco Japan manufactures an optional, external monitor that uses red and green lights and a buzzer with its failure detection circuit. The dual-phase high voltage power source with a trip circuit manufactured by Simco USA demonstrates another approach for designing sensing circuits which determine the secondary voltage from the cap-coil of the ferroresonant transformer. The detection signal is used to operate a relay that turns "on" a flashing light and disconnects power to the transformer. The circuit can only be used with ferroresonant transformers and must be part of the high voltage power source. The threshold for voltage trip-out, and delay before the full trip-out, can be adjusted, but are fixed in practice. The trip circuit is also commercially available as a stand-alone unit or as an integral part of a single phase high voltage power source. Sophisticated sensors (such as that shown in U.S. Pat. No. 3,584,258) discriminate between a streamer corona and the non-carbonizing sparks within the dielectric, high leakage currents, and arcs. Other similar circuits are available in the industry.

Capacitively coupled sensors obtain signals that are used to detect high voltage through the capacitance of the insulation system. This approach has an advantage in some applications where the sensor is to be incorporated in the capacitively coupled ionizer. Such ionizers are often compact in design and thus require that the insulation system remain unbroken while securing measurements. In these compact ionizers, breaks in the insulation system become failure points for the electrode system. Additionally, there are other disadvantages with capacitively coupled sensors. The current from the capacitive sensor is typically on the order of ten microamperes or less. The small amount of current makes it difficult to power a sensor sufficiently to generate a sufficiently visible indication of electrode failure. Furthermore, to use capacitance to detect a voltage requires that a time varying current be present in the wire. Unfortunately, electrical sparking during electrode or insulation system failure in any part of the ionizer, cable, or high voltage power source system will send high voltage transients through the capacitively coupled indicator circuits which will interfere with the signal detected by the sensor. Sophisticated transient limiting circuits are needed to prevent the burn out of electronics circuits and capacitive sensors, such as electroluminescent devices.

Some capacitively coupled sensors use capacitive-coupling with an operational amplifier (which may be either linear or analog) and a comparator to operate a relay. Outputs from the circuit include a light emitting diode and terminal for a direct current signal between twelve and fifteen volts (Haug).

Circuits powered from the mains, whether directly or capacitively coupled, are generally too expensive for the majority of commercial applications. For this reason, a demand exists for circuits that are separately manufactured which can indicate the presence of a high voltage. The sensor's circuit construction must enable a low cost, visible indication of the detected high voltage, and have a component life which exceeds that of the other components of the alternating current static eliminator system.

A better indication of high voltage from capacitively coupled sensors can be obtained using a spark gap to store energy and spark over through a sensor. Such a principle is incorporated in Simco's Static Bar Checker. The use of a spark gap is not feasible for continuous use because of erosion of the gap and attendant radio frequency interference caused by the sparking.

Another approach incorporates rectifying diodes and a storage capacitor to produce a bright, blinking indication of high voltage. The connection to the static bar is accomplished by either a direct ring placement around the inner bar (such as a high voltage cable insulation system) or by connection to a pin of the capacitively coupled bar. Such a circuit is illustrated in Simco drawings 4220054 (Jul. 20, 1982) and the physical arrangement of the components is shown in Simco drawing 4101579 (Jun. 22, 1984). This technique was also implemented by Simco in their industrial ionizing air blowers (e.g., the AS-20 air blower). Space limitations in the more compact ionizers prevent the connection to a pin of the capacitively coupled bar. Circuits of this type have been used for hot line detection, for high voltage switch gear and transmission lines (as shown in U.S. Pat. Nos. 3,970,932; 3,991,367; 4,259,545; 4,794,329; 4,814,933; 5,051,733; and 5,065,142) and test probes (as shown in U.S. Pat. Nos. 4,152,643 and 4,870, 343).

Alternatively, a series circuit including a capacitor, resistor, and neon light can be placed between the high voltage wires. The size of this capacitor is usually five to ten times greater than the capacitance of the sensor in capacitively coupled sensors. The use of a discreet capacitor in the circuit is a lower cost method for melding the direct and capacitively coupled designs for high voltage sensors. Simco has incorporated this type of circuit in several of their ionizing air blowers (such as the Aerostat XC, Aerostat PC, and the Guardian Overhead Aerostat) and an ionizing airgun (such as the Top Gun power unit).

Simco has attempted to use various sensors over the years that were directly incorporated into the actual static bar component for web and sheet handling applications, but discovered that such direct mounting of sensors onto static elimination bars creates many difficulties. The first difficulty is that each different model static bar requires a unique design for the sensor that is incorporated therein. Additionally, static bars are often placed in locations where the light which was mounted thereon could not be seen. Another difficulty was caused by neon light sensors sometimes yielding premature static bar failure indications because of the limited space that is available in the bar construction. Furthermore, the physical size of the static bars which incorporated sensors were less desirable to customers. Still another problem with incorporating sensors with static bars is that the use of multiple sensors when using multiple bars tends to be inconvenient. This is especially irksome when one conveniently placed sensor could be used to determine if the proper amount of power is being supplied to each of the bars.

What is needed, but so far not provided by the prior art, is a high voltage sensor that monitors the voltage between a high voltage power source and a static eliminator; that monitors the output of the secondary winding and thus, is not shorted out by failures of the ionizer, the high voltage wires, or the transformer insulation systems; that is a separate component from the high voltage power source and that is insertable therein; that can be used with systems having various cable designs and electrode voltages, including ionizers where neither electrode is at ground potential; that can be positioned at the high voltage power source or at any convenient location along the wires connecting the high voltage power source to the static eliminators; that has a construction which exceeds the durability of other components of the ionizer system; and that is manufacturable at a relatively low cost.

SUMMARY OF THE INVENTION

The present invention is directed to a high voltage sensor adapted to be connected to a terminal. The terminal is disposed in a housing having an outer surface and having a chute extending inwardly from the outer surface to a distal position inside of the housing. The high voltage sensor includes a sensor body adapted to be inserted into the chute and having a distal end and a proximal end. A contact is mounted on the distal end of the sensor body. An indicator circuit is substantially enclosed in the sensor body and includes an indicator lamp. The indicator circuit is electrically connected to the contact and the terminal is in electrical contact with the contact upon insertion of the sensor body into the chute of the housing.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1a is an electrical schematic of a preferred embodiment of an indicator circuit according to the present invention;

FIG. 1b is an electrical schematic of a second embodiment of an indicator circuit according to the present invention;

FIG. 1c is an electrical schematic of a third embodiment of an indicator circuit according to the present invention;

FIG. 2a is an elevational view of the preferred embodiment of the high voltage sensor according to the present invention;

FIG. 2b is an elevational view of a second embodiment of a high voltage sensor according to the present invention;

DETAILED DESCRIPTION OF THE INVENTION

Figure 3:
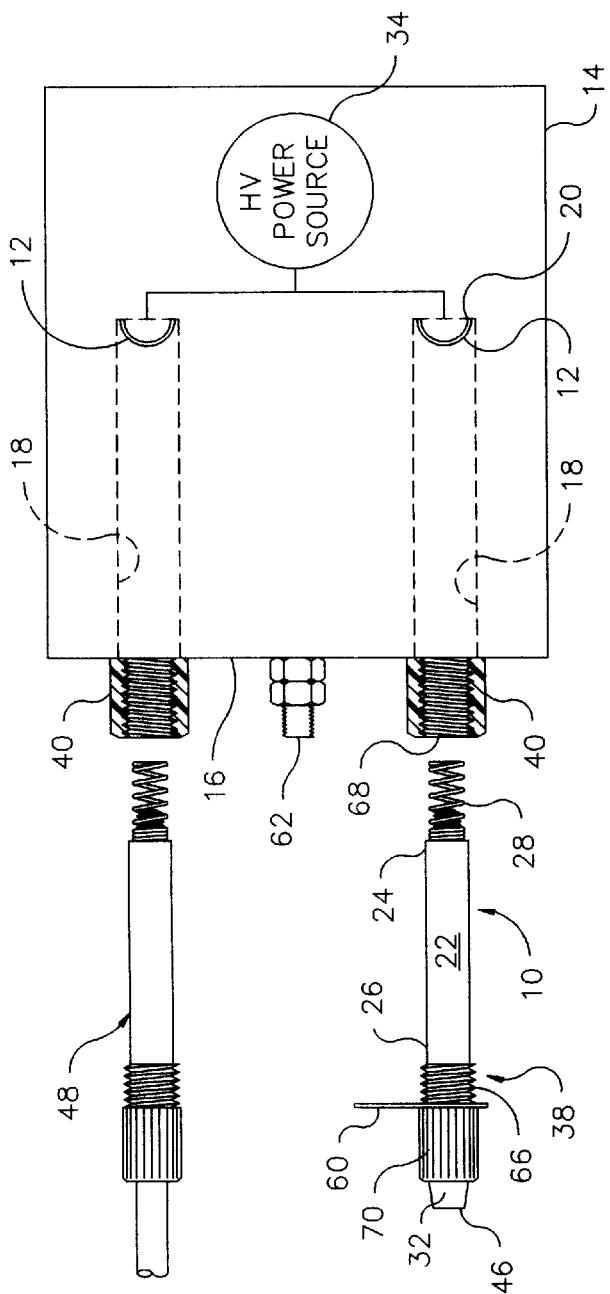
FIG. 3 is a planar view, partially in cross-section, of the high voltage sensor of FIG. 2a and a typical high voltage power source.

Certain terminology is used in the following description for convenience only and is not limiting. The words "right," "left," "lower," and "upper" designate directions in the drawings to which reference is made. The words "inwardly" and "outwardly" refer to directions toward and away from, respectively, the geometric center of the high voltage sensor and designated parts thereof. The terminology includes the words above specifically mentioned, derivatives thereof and words of similar import. Additionally, the word "a," as used in the specification and in the claims, means "at least one."

Referring to the drawings in detail, wherein like numerals indicate like elements throughout, there is shown in FIGS. 1a–4 preferred embodiments of a high voltage sensor, generally designated 10. Generally speaking, the high voltage sensor 10 has a contact 28 for electrically connecting to a terminal 12. Once the contact 28 is connected to the terminal 12, an an indicator circuit 30A, 30B, or 30C causes the indicator lamp 32 to illuminate while the proper amount of the power is being supplied to the terminal 12.

Figure 4:
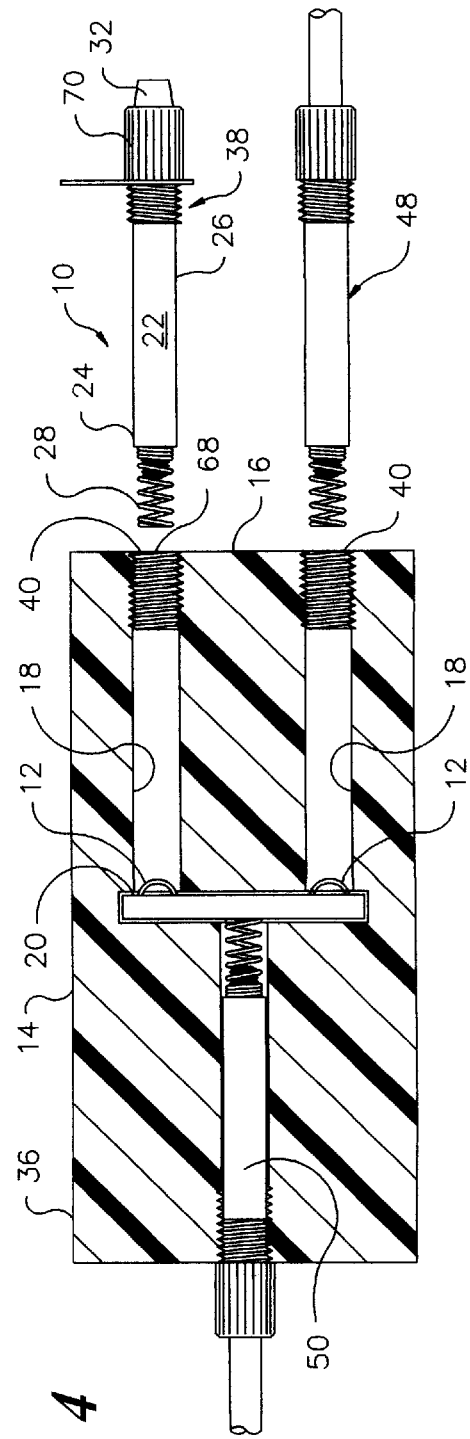
FIG. 4 is a planar view, partially in cross-section, of the high voltage sensor of FIG. 2a and a typical terminal block.

The high voltage sensor 10 is adapted to be connected to the terminal 12. The terminal 12 is disposed in a housing 14 having an outer surface 16 and having a chute 18 extending inwardly from the outer surface to a distal position 20 inside the housing 14. Referring to FIGS. 3 and 4, the housing 14 is preferably either one of a high voltage power source 34 or a terminal block 36. The chute 18 in both the high voltage power source 34 and in the terminal block 36 is generally cylindrical and extends from the outer surface 16 into the high voltage power source 34 or the terminal block 36. In both cases, the chute 18 extends into the housing 14 and terminates at a terminal 12 which is capable of receiving a voltage.

Both the high voltage power source 34 and the terminal block 36 have two chutes 18 that extend into the housing 14 from the outer surface 16 and are preferably identical. The ends of the chutes 18 that are proximate to the outer surface 16 of the housing 14 terminate at a fastener receiving element 40, described below. While it is preferable that the chutes 18 are cylindrical in shape, those of skill in the art will appreciate from this disclosure that the chutes 18 can have a square cross-section, a hexagonal cross-section, or a polygonal cross-section without departing from the spirit and scope of the present invention. The important aspect of the chute 18 is that it is capable of receiving the high voltage sensor 10.

The high voltage sensor 10 includes a sensor body 22 which is adapted to be inserted into the chute 18 and has a distal end 24 and a proximal end 26. The sensor body 22 is preferably cylindrically shaped and insulates the circuitry contained within from the surroundings. While it is preferable that the sensor body 22 is cylindrically shaped, those of skill in the art will appreciate from this disclosure that the present invention is not limited to cylindrically shaped sensor bodies 22. For example, the sensor body 22 can have a square, hexagonal, or polygonal cross-sectional shape as taken along the line A—A in FIG. 2a.

Generally speaking, the distal end 24 of the sensor body 22 is designed to be brought into contact with the terminal 12 and the proximal end 26 of the sensor body 22 is designed to be generally grasped by a user to manipulate the high voltage sensor 10. A contact 28 is mounted on the distal end 24 of the sensor body 22. The contact 28 is used to connect the high voltage sensor 10 to the terminal 12. As shown in FIGS. 2a–4, the contact 28 is preferably a spring contact. However, those of skill in the art will appreciate from this disclosure that the present invention is not limited to the particular type of contact 28 that is used with the high voltage sensor 10. An important aspect of the contact 28 is that it electrically connects the circuitry of the high voltage sensor 10 to the terminal 12.

Referring to FIGS. 2a and 2b, the contact 28 is attached over an electrical prong 42 that is attached to the distal end 24 of the housing 22. The spring contact 28 is preferably connected to the electrical prong 42 by radially compressive forces that are created by the rightmost coils 44 of the spring contact 28 being forced over the electrical prong 42 as viewed in FIGS. 2a and 2b. Alternatively, the rightmost coils 44 can be soldered or integrally formed with the electrical prong 42. The combination of the sensor body 22 and the spring contact 28 results in the high voltage sensor 10 being adapted to contact an output terminal 12 of the high voltage power source 34 enclosed by the housing 14. The terminal 12 is in electrical contact with the contact 28 upon insertion of the sensor body 22 into the chute 18 of the housing 14.

The sensor body 22 is smoothly received by the chute 18 which is preferably cylindrically shaped as shown in FIG. 3.

The length of the sensor body 22 is preferably such that the spring contact 28 is forced into engagement with the terminal 12 when the high voltage sensor 10 is inserted into the high voltage power source 34. In addition, the high voltage sensor 10 is adapted to contact an output terminal 12 of a terminal block 36 that is electrically connected to an output terminal 12 of a high voltage power source 34. Referring to FIG. 4, the spring contact 28 is brought into electrical contact with the terminal 12 by the insertion of the high voltage sensor 10 into the chute 18.

An indicator circuit 30A–30C is substantially enclosed in the sensor body 22. FIGS. 1a–1c illustrate three embodiments of an indicator circuit 30A–30C for use with the high voltage sensor 10. While the electrical scheimatics shown in FIGS. 1a–1c illustrate preferred embodiments of the indicator circuits 30A–30C for use with the high voltage sensor 10, those of skill in the art will appreciate from this disclosure that the present invention is not limited to the indicator circuits 30A–30C. An aspect of importance of the indicator circuits 30A–30C is that they transfer power from the terminal 12 to an indicator lamp 32.

Referring to FIGS. 1a–1c, the first circuit terminal 58A is connected to the high voltage terminal 12 or wire and the second circuit terminal 58B is connected to ground. Referring to FIG. 1a, the first indicator circuit 30A comprises a capacitor 52 in series with an indicator lamp 32. The preferred embodiment of the indicator lamp 32 is a neon bulb, however, those of skill in the art will appreciate from this disclosure that any suitable light illuminating device can be used as the indicator lamp 32.

Referring to FIG. 1b, a second indicator circuit 30B comprises a capacitor 52, a resistor 54 and an indicator lamp 32 arranged in series. Referring to FIG. 1c, the third indicator circuit 30C comprises a capacitor 52, two diodes 56, and an indicator lamp 32.

The combination of components used in the third indicator circuit 30C results in a flashing indicator lamp 32 during the time that a predetermined voltage is being detected by the high voltage sensor 10. The frequency of the flashing of the indicator lamp 32 depends on the size of the capacitors 52.

The value of the capacitors 52 in the above indicator circuits 30A–30C is typically in the range of fifty to one hundred picofarads. However, those of skill in the art will appreciate that the value of the capacitor 52 may be adjusted depending on the particular indicator circuit without departing from the scope of the present invention. The capacitor 52 can be a discrete capacitor, a capacitor element, or a capacitor derived from the insulated union between the high voltage wire and the high voltage indicator circuit.

The indicator circuit 30A–30C includes an indicator lamp 32. The indicator circuit 30A–30C is electrically connected to the contact 28. Referring to FIG. 2a, the indicator lamp 32 is mounted on the proximal end 26 of the sensor body 22. The indicator lamp 32 is covered by a lens 46 to allow one to easily observe whether the indicator lamp 32 is illuminated.

Attached proximate to the fastener mechanism 38 of the sensor body 22 is a ground lead 60. Referring to FIG. 3, the ground lead 60 is meant to engage the grounded terminal 62 on the outer surface 16 of the housing 14. Thus, to complete the circuit formed by the indicator circuit 30A contained in the high voltage sensor 10 of FIG. 2a, the spring contact 28 is inserted into the chute 18 to contact the terminal 12 and the ground lead 60 is fastened to the grounded terminal 62.

Referring to FIG. 2b, the indicator lamp 32 is mounted along the sensor body 22. A portion 64 of the sensor body 22 is translucent or transparent to allow the indicator lamp 32 to be easily observed. This embodiment of the high voltage sensor 10 is particularly useful in combination with a transparent or translucent terminal block 36. The ground lead 60 can connect to either a grounded terminal or an ungrounded terminal. This embodiment is useful with alternating current static eliminators in which both terminals are maintained at a voltage other than ground.

Referring to FIG. 4, the high voltage sensor 10 can be inserted into the terminal block 36 and the terminal block 36 can be conveniently located to allow easier monitoring of the high voltage power source 34 due to the improved visibility of the indicator lamp 32. The terminal block 36 is preferably formed of a durable insulative material suited to commercial use, such as nylon, ABS, Teflon, fiberglass, or the like. It is more preferable, but not necessary, that the terminal block 36 be fabricated from a transparent or translucent material to allow the second embodiment of a high voltage sensor 10 (showvn in FIG. 2b) to be used. The use of the terminal block 36 allows the high voltage sensor 10 to be positioned at any convenient location between the high voltage power source 34 and the static eliminator.

A power supply connector 50 attaches to one end of the terminal block 36 and is connected to a high voltage power source 34. On the right side of the terminal block 36 are two chutes 18 that receive the high voltage sensor 10 and a power transmitting connector 48. The power supply connector 50, the power transmitting connector 48, and the high voltage sensor 10 have substantially identical outer configurations and can be interchangeably inserted into any of the chutes 18. However, it is common to have the power supply connector 50 permanently attached to the left side of the terminal block 36, as viewed in FIG. 4.

When positioning the terminal block 36 between a high voltage power source 34 and a static eliminator, the terminal block 36 is positioned in a convenient location for observation and a power supply connector 50 is used to transfer power from a high voltage power source 34 to the terminal block 36. The power that is received by the terminal block 36 is transferred to the terminals 12 positioned at distal positions 20 within the terminal block 36. The high voltage sensor 10 is inserted into one of the chutes 18 to bring the spring contact 28 into electrical contact with one of the terminals 12. Then, the power transmitting connector 48 is inserted inside the remaining chute 18 to transfer the power (supplied via the power supply connector 50) to a static eliminator, or any other device requiring a voltage power source.

When the high voltage sensor 10 is used in direct conjunction with a high voltage power source 34, as shown in FIG. 4, the high voltage sensor 10 is inserted into one of the chutes 18 to bring the spring contact 28 into electrical contact with a terminal 12. The remaining chute 18 accommodates the power transmitting connector 48 which transfers power from the high voltage power source 34 to the static eliminator, or any other device requiring a voltage input. While the insertion of the high voltage sensor 10 into a chute 18 of an alternating current power source 34 reduces the number of available connections to the power source 34 by one, the high voltage sensor 10 substantially eliminates the need for an illuminable power "on" light for the primary of the transformer. Thus, for single-ionizer applications, the ability to insert the connector into the high voltage power source 34 allows for the detection of a high voltage power supply without the need of a terminal block. Thus, when the high voltage sensor 10 is used in combination with a high voltage power source 34, the system can be assembled at the lowest possible cost.

Both embodiments of the high voltage sensor 10 have a fastener mechanism 38 positioned on the proximal end 26 of the sensor body 22. The fastener mechanism 38 has a plurality of outwardly extending threads 66. The outwardly extending threads 66 of the fastener mechanism 38 are fastenably engagable with the interior threads 68 of the fastener elements 40. Thus, the high voltage sensor 10 can be fastenably secured inside of either the terminal block 36 or the high voltage power source 34. While the preferred embodiment of the high voltage sensor 10 uses threads to fastenably secure the high voltage sensors 10 in position inside of the chute 18, those of skill in the art will appreciate from this disclosure that the present invention is not limited to high voltage sensors 10 having a fastener mechanism 38 for securely fixing the high voltage sensor 10 within a chute 18.

Referring to FIGS. 2a–4 , the high voltage sensor 10 is operated as follows. To place an indicator lamp 32 directly on a high voltage power source 34, the sensor body 22 is longitudinally aligned with a chute 18 in the housing 14. Then, the high voltage sensor 10 is inserted into the chute 18 until the outwardly extending threads 66 of the fastening mechanism 38 begin to engage the interior threads 68 of the fastener receiving element 40. Once the fastener mechanism 38 of the high voltage sensor 10 begins to engage the fastener element 40 of the high voltage power source 34, the user rotates the grip portion 70 of the high voltage sensor 10 to cause the fastener mechanism 38 to fully engage the fastener receiving element 40.

As the high voltage sensor 10 is fastenably secured to the high voltage power source 34, the spring contact 28 securely contacts the terminal 12 of the high voltage power source 34. Accordingly, it is the fastener mechanism 38 along the proximal end 26 of the sensor body 22 that secures the sensor body 22 in the chute 18 of the housing 14. After the high voltage sensor 10 is fully engaged with the high voltage power source 34, the ground lead 60 is attached to the grounded terminal 62. Then, a power transmitting connector 48 is similarly engaged with the high voltage power source 34 to transfer power to an electrical device requiring a voltage input.

Referring to FIGS. 3 and 4, when the high voltage sensor 10 is to be used with a terminal block 36, the terminal block is first positioned in a convenient location for observation by users. Then, a high voltage sensor 10 is inserted in a manner similar to that described above into one of the chutes 18 in the right side of the terminal block 36 (as viewed in FIG. 4). Then, a power supply connector 50 is engaged with the left side of the terminal block 36 (which transmits a voltage from the high voltage power source 34 to the terminal block 36) to supply a voltage to both of the terminals 12 in the terminal block 36. Then, a power transmitting connector 48 is inserted in the remaining chute 18 to transfer power from the terminal block 36 to an electrical device requiring a voltage input.

It is recognized by those skilled in the art, that changes may be made to the above-described embodiments of the invention without departing from the broad inventive concept thereof. It is understood, therefore, that this invention is not limited to the particular embodiments disclosed, but is intended to cover all modifications which are within the spirit and scope of the invention as defined by the appended claims.

I claim:

1. A high voltage sensor assembly adapted to be inserted between a high voltage power source and a device powered by the power source, the high voltage sensor assembly comprising:
   a terminal block having at least three chutes extending inwardly from one or more outer surfaces to a distal position inside the terminal block; and
   a high voltage sensor fastenably engaged with a first one of the chutes, the high voltage sensor including:
   (i) a sensor body inserted into the first one of the chutes and having a distal end and a proximal end,
   (ii) a contact mounted on the distal end of the sensor body, and
   (iii) an indicator circuit substantially enclosed in the sensor body, the indicator circuit including an indicator lamp, the indicator circuit being electrically connected to the contact, wherein the high voltage sensor continuously monitors high voltage power fed through the terminal block.

2. The high voltage sensor assembly of claim 1, wherein the sensor body bears a fastener mechanism along the proximal end that secures the sensor body in the first chute.

3. The high voltage sensor assembly of claim 1, wherein the chutes are cylindrically shaped.

4. The high voltage sensor assembly of claim 1, wherein the indicator lamp is mounted on the proximal end of the sensor body.

5. The high voltage sensor assembly of claim 1, wherein the indicator lamp is mounted along the sensor body.

6. The high voltage sensor assembly of claim 1, wherein the contact is a spring contact.

7. The high voltage sensor assembly of claim 1, wherein the terminal block is comprised of a material selected from the group consisting of nylon, ABS, Teflon and fiberglass.

8. The high voltage sensor assembly of claim 1, wherein the first chute has interior threads with which the high voltage sensor is fastenably engaged with.

9. The high voltage sensor assembly of claim 1, wherein the high voltage power is inputted into a second one of the chutes via a first connector fastenably engaged with the second chute.

10. The high voltage sensor assembly of claim 1, wherein the device powered by the power supply is a static eliminator.

11. The high voltage sensor assembly of claim 7, wherein at least a portion of the sensor body is translucent or transparent.

12. The high voltage sensor assembly of claim 11, wherein the terminal block is transparent or translucent, such that the indicator lamp can be viewed through the terminal block when the indicator lamp is illuminated.

13. The high voltage sensor assembly of claim 9, wherein the high voltage power is outputted from a third one of the chutes via a second connector fastenably engaged with the third chute.

14. The high voltage sensor assembly of claim 13, wherein the terminal block further comprises a plurality of interconnected high voltage terminals located at the distal position inside the terminal block, wherein the contact mounted on the distal end of the sensor body, and contacts on distal ends of the first and second connectors, are electrically connected to respective ones of the interconnected high voltage terminals.

15. The high voltage sensor assembly of claim 13, wherein the sensor body, the first connector and the second connector may be interchanged as desired.

16. The high voltage sensor assembly of claim 13, wherein the second and third chutes have interior threads with which the first and second connectors are fastenably engaged with.

* * * * *